(12) United States Patent
Bona et al.

(10) Patent No.: US 11,300,592 B2
(45) Date of Patent: Apr. 12, 2022

(54) TERMINAL BLOCK FOR CURRENT MEASUREMENT AND RELATED METHODS

(71) Applicant: Hitachi Energy Switzerland AG, Baden (CH)

(72) Inventors: Calogero Bona, Oberrohrdorf (CH); Francesco Rizzo, Urdorf (CH); Jimmy Kjellsson, Västeras (SE)

(73) Assignee: Hitachi Energy Switzerland AG, Baden (CH)

( * ) Notice: Subject to any disclaimer, the term of this patent is extended or adjusted under 35 U.S.C. 154(b) by 161 days.

(21) Appl. No.: 16/416,721

(22) Filed: May 20, 2019

(65) Prior Publication Data

US 2019/0353687 A1    Nov. 21, 2019

(30) Foreign Application Priority Data

May 18, 2018  (EP) .................................... 18173287

(51) Int. Cl.
| | | |
|---|---|---|
| *G01R 19/00* | (2006.01) | |
| *G01R 11/04* | (2006.01) | |
| *G01R 19/32* | (2006.01) | |
| *G01R 19/252* | (2006.01) | |
| *H01R 9/24* | (2006.01) | |
| *G01R 1/20* | (2006.01) | |
| *G01R 19/25* | (2006.01) | |

(52) U.S. Cl.
CPC ......... *G01R 19/0092* (2013.01); *G01R 1/203* (2013.01); *G01R 11/04* (2013.01); *G01R 19/252* (2013.01); *G01R 19/2503* (2013.01); *G01R 19/32* (2013.01); *H01R 9/24* (2013.01)

(58) Field of Classification Search
None
See application file for complete search history.

(56) References Cited

U.S. PATENT DOCUMENTS

| | | |
|---|---|---|
| 6,028,426 A | 2/2000 | Cameron et al. |
| 6,671,635 B1 | 12/2003 | Forth et al. |

(Continued)

FOREIGN PATENT DOCUMENTS

| | | |
|---|---|---|
| CN | 202421266 U | 9/2012 |
| DE | 19653475 | 6/1998 |

(Continued)

OTHER PUBLICATIONS

Dallas Semiconductor Maxim, "Industry's Most Efficient Solution for Embedding Calibration Data with Analog Sensors," 2002, 1 page.

*Primary Examiner* — Jermele M Hollington
(74) *Attorney, Agent, or Firm* — Slater Matsil, LLP (57) ABSTRACT

A terminal block for current measurement in a power grid. The terminal block includes a shunt and a temperature sensor, and is configured to be connected to an Intelligent Electronic Device IED and a primary device. Furthermore, a respective IED and a system for current measurement including the IED and the terminal block are disclosed as well as a method for calibration of the system and a method for current measurement in power grids. A voltage measurement unit in the IED is adapted to measure a voltage drop at the shunt; a current flowing through the shunt can be calculated from the temperature and from calibration data. The terminal block enables a particularly efficient calibration method.

21 Claims, 3 Drawing Sheets

(56) References Cited

U.S. PATENT DOCUMENTS

| | | | |
|---|---|---|---|
| 8,698,426 B1 | 4/2014 | Nguyen et al. | |
| 11,150,290 B2* | 10/2021 | Dase | G01R 31/085 |
| 2015/0120230 A1 | 4/2015 | Banhegyesi | |
| 2015/0142356 A1 | 5/2015 | Thomas et al. | |
| 2018/0284159 A1* | 10/2018 | Callanan | G01R 19/2506 |
| 2021/0143633 A1* | 5/2021 | Naidu | H02H 7/263 |
| 2021/0247826 A1* | 8/2021 | Yang | G06F 1/263 |

FOREIGN PATENT DOCUMENTS

| | | |
|---|---|---|
| KR | 101653227 B1 | 9/2016 |
| WO | 9909421 | 2/1999 |

\* cited by examiner

TERMINAL BLOCK FOR CURRENT MEASUREMENT AND RELATED METHODS

FIELD OF THE INVENTION

The present invention relates to the field of current measurement in power grids, e.g., in substations or in substation automation systems. In particular, the present invention relates to a terminal block for current measurement, to a system for current measurement comprising such a terminal block, to a method for calibrating such a system, and to a method for measuring a current.

BACKGROUND OF THE INVENTION

In power grids, in particular substations, electrical current measurements are conducted for protection, control, metering, and automation purposes. Often, as primary equipment for a measurement of current or an alternating current, AC, a primary current transformer, CT, is used. The primary CT galvanically separates the measurement circuit from primary lines, which can be at high voltage, and also provides a secondary current that is, at least during normal operation, proportional to the primary current. Nowadays, measurement of the secondary current for purposes of control, protection, and metering is performed by an Intelligent Electronic Device, IED, e.g., by means of a secondary CT or a shunt, integrated into the analog front-end of the IED In contrast to a secondary CT, a shunt offers a flat frequency response, but may have a higher sensitivity to temperature variations. As a remedy, the shunt is made of a material with low temperature coefficient of resistance and/or is arranged in a way that enables good transport of heat. Still, the temperature dependence of the shunt represents a limitation of the accuracy of the current measurement.

DE 196 53 475 discloses an adapter terminal block, comprising a measurement circuit, connectable to at least two current transformers and to a three-phase current meter.

DESCRIPTION OF THE INVENTION

It is an objective of the present invention to provide a terminal block comprising a shunt that enables an accurate current measurement by an Intelligent Electronic Device IED connected to the terminal block, in particular, independent of a temperature of the shunt, and enabling an efficient calibration method. Further objectives are to provide an IED, configured to be connected to the terminal block, and to provide a system for current measurement, comprising the IED and the terminal block according to the present invention. Further objectives are to provide said calibration method of the system and a method for measuring a current.

These objectives are achieved by the subject-matter of the independent claims. Further exemplary embodiments are evident from the dependent claims and the following description.

A first aspect of the present invention relates to a terminal block for current measurement in a power grid, in particular, in a substation or in a substation automation system, wherein the terminal block comprises a shunt, a first and a second current terminal, a first and a second sensing terminal, and a temperature sensor. Herein, a first end of the shunt is connected to the first current terminal and to the first sensing terminal, a second end of the shunt is connected to the second current terminal and to the second sensing terminal, the first and the second current terminal are configured to be connected to secondary outputs of a primary device, in particular a current transformer or a primary current transformer, the first and the second sensing terminal are configured to be releasably connected to an IED, and the sensor is configured or adapted to measure a temperature of the terminal block or of the shunt that is a first data item of calibration parameters of the shunt or of the terminal block. The calibration parameters of the shunt or of the terminal block may provide a correction for a temperature dependence of a resistance of the shunt and/or conversion from a voltage drop at the shunt in a current flowing through the shunt; as a result of the temperature dependence of the resistance of the shunt, the calibration parameters comprise the temperature of the shunt or of the terminal block.

In exemplary embodiments of this first aspect, the terminal comprises a memory, a non-volatile memory, an EEPROM, or a flash memory, which is adapted/configured to store calibration data of the shunt and/or of the terminal block, wherein the calibration data is a second data item of the calibration parameters of the shunt or of the terminal block. The calibration data can be a look-up table, e.g., a table of temperature vs. resistance, or a functional dependence giving the resistance as a function of the temperature, e.g., a linear or polynomial function, in particular, a polynomial of $3^{rd}$ or $4^{th}$ order.

In an exemplary embodiment of this aspect, the first and the second sensing terminal are formed as plug-in connectors or first plug-in connectors adapted/configured to be plugged into socket connectors or first socket connectors of the IED.

In exemplary embodiments of this first aspect, the terminal block comprises means adapted to transmit power to the terminal block and/or to provide the IED with at least parts of the calibration parameters of the shunt or of the terminal block. These means can be a combination or one of a fiber-optical link, calibration terminals, and a wireless transmission unit.

In further exemplary embodiments of this first aspect, the terminal block comprises calibration terminals configured to be releasably connected to the IED Herein, the calibration terminals are adapted/configured to transmit power to the terminal block and/or to provide the IED with at least parts of the calibration parameters of the shunt or of the terminal block. In an exemplary embodiment, the calibration terminals are formed as plug-in connectors or second plug-in connectors configured to be plugged into socket connectors or second socket connectors of the IED.

In another exemplary embodiment of the first aspect, the terminal block comprises a wireless transmission unit, in particular an RFID unit, adapted/configured to provide the IED with at least parts of the calibration parameters of the shunt or of the terminal block.

In embodiments of the first aspect, the first and the second sensing terminal adapted/configured to be connected to a first and a second input of a voltage measurement unit in the IED. In particular embodiments, the voltage measurement unit comprises an analog-to-digital converter and may comprise an amplifier, in particular, an analog amplifier, and a frequency filter, in particular, a high-pass or low-pass, or a band-pass filter.

In a further embodiment of the first aspect of the present invention, the first and the second current terminal are adapted/configured to clamp wires connected to the primary device.

A second aspect of the present invention relates to an Intelligent Electronic Device IED for current measurement in a power grid, in particular, in a substation or in a substation automation system, configured to be connected, in particular, releasably connected, with the terminal block according to embodiments of the first aspect of the present invention. In particular, herein, the IED comprises first IED terminals, in particular, formed as first socket connectors, configured or adapted to be connected to the first and the second sensing terminal of the terminal block according to the first aspect of the present invention. Further, the IED may comprise second IED terminals, in particular, formed as second socket connectors, adapted or configured to transmit power to the terminal block and/or to receive at least parts of the calibration parameters of the shunt. The IED can comprise a wireless receiving unit adapted or configured to receive at least parts of the calibration parameters of the shunt. The IED can further comprise a voltage measurement unit, in particular, with inputs, in particular a first and a second input, connected to the first IED terminals, and adapted or configured to be connected, in particular via the first IED terminals, with the first and second sensing terminal of the terminal block. The first input of the voltage measurement unit is, in particular, configured or adapted to be connected to the first sensing terminal of the terminal block. The second input of the voltage measurement unit is, in particular, configured or adapted to be connected to the second sensing terminal of the terminal block. The voltage measurement unit may comprise an analog-to-digital converter and may comprise an amplifier, in particular, an analog amplifier, and a frequency filter, in particular, a high-pass, a low-pass, or a band-pass filter. The voltage measurement unit is configured or adapted to measure a voltage drop at the shunt. The IED may further comprise a calibration unit that is configured or adapted to calculate, from the calibration parameters of the shunt or the parts of calibration parameters of the shunt and the voltage drop at the shunt, a current flowing through the shunt and/or a primary current of the primary device.

A third aspect of the present invention relates to a system for current measurement in a power grid, in particular, in a substation or in a substation automation system, comprising the terminal block according to embodiments of the first aspect of the present invention and an Intelligent Electronic Device IED, in particular, the IED according to the second aspect of the invention, connected, in particular, releasably connected, to the terminal block. In embodiments, the system further comprises a primary device, in particular, a primary current transformer or current transformer, with secondary outputs, connected, in particular, releasably connected, to the first and the second current terminal of the terminal block.

A fourth aspect of the present invention relates to a method for calibrating a current measurement system in a power grid, in particular, in a substation or in a substation automation system. The method can be considered as a process specially adapted for calibrating or manufacturing of the terminal block according to the first aspect of the present invention or of the system according to the third aspect of the present invention. The method comprises:
  connecting a first and a second current terminal of a terminal block to outputs of a current supply,
  connecting a first and a second sensing terminal of the terminal block to inputs of a voltmeter,
  measuring, at at least two, in particular, at least five, more particular, at least ten, temperatures of the terminal block, respective at least two voltage drops at a shunt in the terminal block via the voltmeter, wherein the shunt is connected with a first end to the first current terminal and the first sensing terminal and with a second end to the second current terminal and second sensing terminal,
  measuring the at least two temperatures of the terminal block, in particular, via a temperature sensor in the terminal block,
  deriving, from the at least two temperatures of the terminal block and the respective at least two voltage drops, calibration data of the shunt, in particular, wherein further a current of the current supply is used,
  storing the calibration data of the shunt, in particular, on a memory in the terminal block.

In exemplary embodiments, the method further comprises:
  measuring a current or respective at least two currents of the current supply, and/or
  loading the calibration data of the shunt into the IED.

In further exemplary embodiments, the method further comprises calibrating the voltage measurement unit in the IED. This step can be, in particular, executed before connecting the first and second sensing terminal of the terminal block to a voltage measurement unit in an Intelligent Electronic Device IED.

A fifth aspect of the present invention relates to a method for measuring a current in a power grid, in particular, in a substations or in a substation automation system. This method can be considered as a use of the terminal block according to the first aspect of the present invention or as the use of the system according to the third aspect of the present invention. The method comprises:
  connecting secondary outputs of a primary device, in particular, a current transformer or a primary current transformer, to a first and a second current terminal of a terminal block,
  connecting a first and a second sensing terminal of the terminal block to inputs of a voltage measurement unit in an Intelligent Electronic Device IED,
  measuring a voltage drop at a shunt in the terminal block via the voltage measurement unit, wherein the shunt is connected with a first end to the first current terminal and the first sensing terminal and with a second end to the second current terminal and the second sensing terminal,
  measuring a temperature of the terminal block, in particular a temperature of the shunt, in particular, via a temperature sensor located in the terminal block or close to the terminal block,
  calculating, in particular in the IED, using calibration data of the shunt, from the voltage drop and the temperature of the terminal block, a current flowing through the shunt, and/or a primary current of the primary device, in particular, wherein the calibration data of the shunt is derived according to the fourth aspect of the present invention.

In an exemplary embodiment, the method further comprises:
  loading the calibration data of the shunt into the IED, in particular, from a memory in the terminal block.

These and other aspects of the present invention will be apparent from and elucidated with reference to the embodiments described hereinafter.

BRIEF DESCRIPTION OF THE DRAWINGS

The subject-matter of the present invention will be explained in more detail in the following text with reference to exemplary embodiments which are illustrated in the attached drawings.

The reference symbols used in the drawings, and their meanings, are listed in summary form in the list of reference symbols. In principle, identical parts are provided with the same reference symbols in the figures.

DETAILED DESCRIPTION OF EXEMPLARY EMBODIMENTS

The present invention will be described in more detail with reference to the drawings, in which exemplary embodiments are shown.

It is to be understood that, throughout the specification and the claims, "to connect", "connected" and "connecting" mean, in particular, "to electrically connect", "electrically connected" and "electrically connecting", respectively, and that "to releasably connect", "releasably connected" and "releasably connecting" mean, in particular, "to electrically and releasably connect", "electrically and releasably connected" and "electrically and releasably connecting", respectively. Further "current" means, in particular "electrical current".

Figure 1:
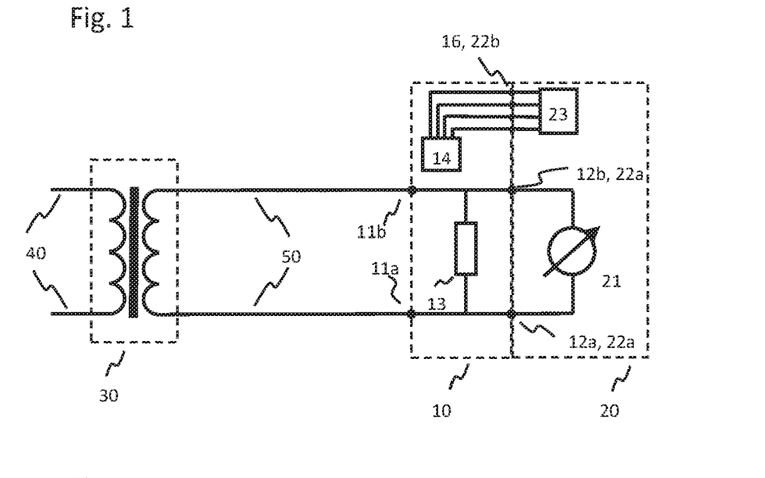
FIG. 1 schematically depicts an embodiment of the third aspect of the present invention. Elements of this figure may not be proportional to one another.

FIG. 1 schematically illustrates an embodiment of a system for current measurement in a power grid according to the present invention. This system comprises a primary device or a primary current transformer 30, an Intelligent Electronic Device IED 20, and a terminal block 10. The terminal block 10, the IED 20 and the system, comprising the IED 20 and the terminal block 10, according to FIG. 1 also represent aspects of the present invention.

The primary device 30 may be a current transformer, but can also be any device that is connected to a wire, wires, a primary line, or primary lines 40 of a power grid and comprises a secondary current output that provides a secondary current that is at least during normal operation proportional or essentially proportional to the primary current in the primary lines. The secondary current may be within or −500 A to 500 A or −100 A to 100 A, but may be in particular during normal operation around a nominal secondary current of −5 to 5 A or 1 to 5 $A_{rms}$, e.g. within −10 to 10 A or 0 to 10 $A_{rms}$. In particular, in case of direct current, DC, the primary device can be an assembly comprising a primary shunt and a fiber-optical bridge; the voltage drop at the primary shunt is converted into an optical signal, transmitted via the fiber-optical bridge, and, subsequently converted into a secondary current that is then measured by an assembly of the terminal block 10 and the IED 20.

The IED 20 may comprise a microprocessor and can have a function for control and/or protection of equipment, in particular primary equipment, of power grids. The IED may be a merging unit, a protective relay, a digital protective relay, a programmable logic controller, or a revenue meter.

The terminal block 10 comprises a shunt 13 and a temperature sensor 14. By arranging the shunt 13 in the terminal block 10, several advantages are achieved. Firstly, calibration of the shunt 13 and of the entire system for current measurement is simplified: Instead of exposing the IED to different temperatures to record the shunt resistance at different temperatures, e.g., by placing the IED in a climate chamber, only the terminal block needs to be exposed to different temperatures, e.g., by placing it in a climate chamber. Secondly, with the temperature sensor 14 in the terminal block 10, calibration of the shunt 13 in the terminal block and current measurement with a system for current measurement comprising the shunt can easily be conducted with the same temperature sensor 14, i.e., potential temperature offsets of the temperature sensor 14 remain the same during calibration and current measurement and have no or only minimal detrimental impact on the accuracy of the current measurement. Thirdly, the IED 20 and the shunt 13 in the terminal block 10 can be efficiently replaced independently of each other. Fourthly, the IED 20 can be disconnected from the primary device 30 without the risk of voltage build-up at the outputs of the primary device 30 as long as the terminal block 10 is connected to the primary device 30.

Wires or secondary lines 50 may be connected to the secondary outputs of the primary device and may transmit the secondary current to the terminal block 10, in particular, a first output of the primary device 30 may be connected to the first current terminal 11a of the terminal block 10 and a second output is connected to the second current terminal 11b of the terminal block 10. The secondary lines or wires 50 can be clamped by the first 11a and the second current terminal 11b to establish a releasable connection. Accordingly, the first 11a and the second current terminal 11b are adapted or configured to be connected or are connectable to the secondary outputs of the primary device 30. The terminal block 10, in particular, a first 12a and a second sensing 12b terminal of the terminal block, are releasably connected or are releasably connectable to the IED 20, in particular, to first IED terminals 22a. First 12a and second 12b sensing terminal are connected or are connectable to a first and second input of voltage measurement unit 21 in the IED 20, in particular, via first IED terminals 22a. The shunt 13 may be a thin film shunt, a wire shunt, or any kind of electrical resistor, in particular, from a material of low thermal coefficient of resistance, and is arranged in the terminal block 10 such that a first end of the shunt 13 is connected to the first current 11a and the first sensing terminal 12a and a second end of the shunt is connected to the second current 11b and the second sensing terminal 12b. The resistance of the shunt 13 may be within 0.01 to 1000 mΩ in particular within 0.1 to 100 mΩ.

The shunt 13 may be further arranged in the terminal block such that thermal flow is optimized and electrical heating of the shunt 13 is minimized, e.g., by arranging the shunt 13 in thermal contact to a heat sink. The shunt 13 may be arranged in a nose or projection of the terminal block 10 and the IED 20 may comprise a recess such that, when the terminal block is connected to the IED 20, the nose or projection resides in the recess of the IED 20. A voltage drop at the shunt 13, originating from a current flowing through the first 11a and the second current terminal 11b, e.g., the secondary current, can be picked up between first 12a and the second 12b sensing terminal. When the terminal block 10 is connected to the IED 20, this voltage drop can be measured by the voltage measurement unit 21 in the IED 20. The first and the second sensing terminal 12a, 12b and the first IED terminals may be formed as connectors of opposite gender, e.g., the first and the second sensing terminal 12a, 12b may be formed as first plug-in connectors while the first IED terminals 22a are formed as first socket connectors enabling a releasable connection to the first and the second sensing terminal 12a, 12b. The voltage measurement unit 21 can comprise an analog-to-digital converter, to convert the voltage drop at the shunt 13 into a digital signal. The voltage measurement unit may further comprise an amplifier, in particular, an analog amplifier, and a frequency filter, in particular, a high-pass or low-pass, or band-pass filter, in order to amplify and filter the voltage drop at the shunt 13 before digitizing. The voltage measurement unit 21 may be adapted to measure voltages from −100 to 100 V, in particular, −10 to 10 V, or −1 to 1 V.

The temperature sensor 14 in the terminal block 10 measures or is adapted/configured to measure a temperature of the terminal block 10 or of the shunt 13. The temperature is part, in particular, a first data item, of calibration parameters of the shunt 13, i.e., is required or used, due to the temperature dependence of the resistance of the shunt 13, together with calibration data to calculate the secondary and/or the primary current from the voltage drop at the shunt 13. The temperature sensor 14 may be adapted to measure temperatures within a temperature range of operation of the IED 20 and/or the terminal block, e.g., from −20° C. to 60° C. or from −40 to 85° C.

The temperature sensor 14 may be arranged in close spatial proximity to the shunt 13, e.g., less than 10 cm, 5 cm, or 1 cm away from the shunt 13 or even in thermal contact to the shunt so that the measured temperature is close to an actual temperature of the shunt 13, in particular within ±10° C., ±5° C., or ±1° C., also in case of electrical heating of the shunt 13.

The temperature sensor may be any kind of temperature sensor, such as a bandgap temperature sensor, a silicon bandgap temperature sensor, a thermocouple, a resistance temperature sensor, e.g., a Pt100 or a Pt1000 sensor, an optical fiber temperature sensor, or a thermistor. The temperature sensor 14 may be arranged in an integrated circuit or may be single component, or may be itself an assembly of different components. In the exemplary embodiment of FIG. 1, the terminal block 10 comprises calibration terminals 16. These calibration terminals 16 are releasably connected or are releasably connectable to the IED 20 and are adapted/configured to transmit power to the terminal block 10 and to provide the IED with the temperature or with at least parts of the calibration parameters of the shunt, in particular, of the first data item of the calibration parameters of the shunt.

In case of a resistance temperature sensor, such as a Pt100 sensor, this can be achieved by a four-wire measurement, i.e., the calibration terminals 16 comprise four terminals. In this case, two terminals are used to apply a current trough the Pt100 sensor, and other two are used to measure a voltage drop at the Pt100 sensor. The voltage drop is proportional to an electrical resistance of the Pt100, and hence enables calculation of the temperature. In other cases, in particular, when the accuracy requirement of the temperature measurement is relaxed, the resistance temperature sensor can also be read out in a two-wire measurement; hence, in this case, the calibration terminals 16 comprise two terminals to read out the temperature. In contrast to such analog readout of the temperature, the temperature can also be read out digitally. In this case, the calibration terminals 16 should provide a digital communication bus between IED and terminal block, such as an I²C bus or a one-wire bus. In case of a I²C bus, the calibration terminals 16 comprise four terminals, one ground terminal, a power supply, e.g., to provide a voltage of +3.3 V to the terminal block, and two signal terminals. In case of one-wire bus, the calibration terminals 16 comprise two terminals, one of the terminals is a ground terminal, the other is used both for communication and power supply. In all examples above, one of the calibration terminals 16, in particular the ground terminal, can be formed as a part of a housing of the terminal block 10, in particular, in case of a at least partially conductive housing such as a at least partially metallic housing.

The IED 20 may comprise second IED terminals 22b. The calibration terminals 16 are releasably connected or are releasably connectable to the IED via the second IED terminals, i.e., they correspond in type and number to the calibration terminals 16 of the terminal block 10 such that the releasable connection between IED 20 and terminal block 10 enables to provide the IED 20 with at least parts of the calibration parameters of the shunt and/or to supply power to the terminal block 10. The calibration terminals 16 and the second IED terminals 22b may be formed as connectors of opposite gender, e.g., the calibration terminals 16 may be formed as second plug-in connectors and the second IED terminals 22b as second socket connectors enabling a releasable connection.

The IED 20 further comprises a calibration unit 23 connected with the second IED terminals 22b that transmit or is adapted/configured to transmit power to the terminal block 10 and receives or is adapted/configured to receive the temperature measured by temperature sensor 14 as part of the calibration parameters of the shunt, in particular as a first data item of the calibration parameters of the shunt. The IED 20 determines, from the temperature and calibration data of the shunt 13, the resistance of the shunt 13 and/or, from the temperature, the calibration data of the shunt 13, and the voltage drop at the shunt, the current flowing through the shunt, the secondary current, and/or the primary current. In particular, the calibration data is a second data item of the calibration parameters of the shunt. It can be a look-up table, e.g., a table of temperature vs. resistance, or a functional dependence giving the resistance as a function of the temperature, e.g., a linear or polynomial function, in particular, a polynomial of $3^{rd}$ or $4^{th}$ order. It goes without saying that instead of temperature or resistance also values indicative of the same can be used, e.g., conductance instead of resistance and a thermistor resistance instead of temperature. The calibration data of the shunt may be stored on or loaded onto the IED 20, in particular at or before commissioning of the system for current measurement. The calibration data can, e.g., be loaded from a cloud storage or a portable memory, such as a flash drive or a memory stick. The calibration data can also be programmed, in particular manually programmed, into the IED 20 using a calibration record. Such a calibration record can be a machine readable code, such as a QR code, e.g., attached to a housing of the terminal block.

Figure 2:
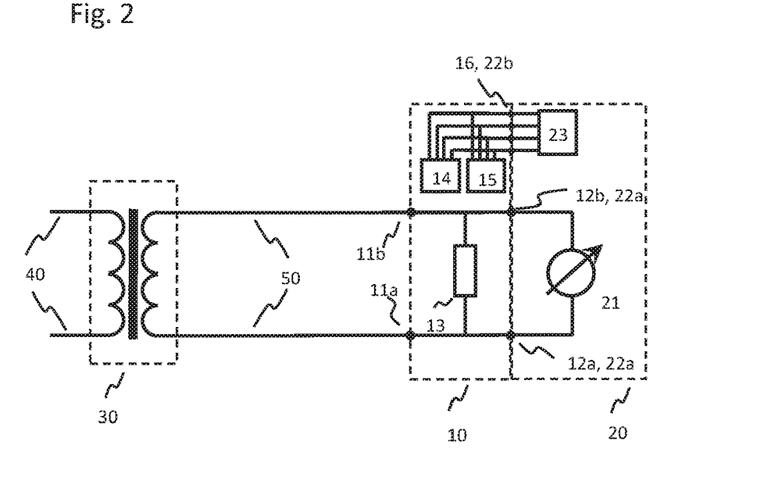
FIG. 2 schematically depicts an exemplary embodiment of the third aspect of the present invention. Elements of this figure may not be proportional to one another.

FIG. 2 schematically illustrates a further exemplary embodiment of a system for current measurement in a power grid according to the present invention. This system comprises a primary device or a primary current transformer 30, an Intelligent Electronic Device IED 20, and a terminal block 10. The terminal block 10, the IED 20 and the system, comprising the IED 20 and the terminal block 10, as illustrated in FIG. 2, also represent aspects of the present invention. In addition to the embodiment illustrated in FIG. 1, the terminal block 10 further comprises a memory 15. All features disclosed in context of the embodiments illustrated in FIG. 1 can also be implemented in the embodiments illustrated in FIG. 2 and disclosed in the following. The memory 15 stores or is adapted/configured to store calibration data of the shunt 13. The calibration data of the shunt 13 is a second data item of calibration parameters of the shunt 13. This memory 15 can, e.g., be a non-volatile memory, a flash memory, or an EEPROM. Integration of the memory 15 into the terminal block 10 has the advantage of a simplified handling of the calibration data.

In the exemplary embodiment of FIG. 2, the terminal block 10 comprises calibration terminals 16. These calibration terminals 16 are releasably connected or are releasably connectable to the IED 20 and transmit or are adapted/configured to transmit power to the terminal block 10 and provide or are adapted/configured to provide the IED with the temperature and/or calibration data or with at least parts of the calibration parameters of the shunt, in particular, of the first data item and/or of the second data item of the calibration parameters of the shunt. In the exemplary embodiment of FIG. 2, the memory 15 uses the same parts of the calibration terminals 16 as the temperature sensor 14. In other words, the same parts of the calibration terminals 16 transmit or are adapted/configured to transmit power to the temperature sensor 14 as well as to the memory 15 and provide are adapted/configured to provide the IED with the temperature as well as the calibration data of the shunt. This can, e.g., be achieved by I$^2$C bus to which the temperature sensor 14 and the memory 15 are connected. In this case, the calibration terminals 16 comprise four terminals. Another option is a one-wire bus to which the temperature sensor 14 and the memory 15 are connected; in this case, the calibration terminals could comprise two terminals. As an alternative, the temperature sensor 14 and the memory 15 can use different parts of the calibration terminals; e.g., temperature sensor 14 and memory 15 can use different I$^2$C buses or different one-wire buses; the temperature sensor 14 formed as Pt100 sensor or resistor could also be read out by the IED 20 using a two- or four-point measurement via a first part of the calibration terminals 16 and the memory 15 could be powered/readout by the IED 20 over an I$^2$C bus via a second part of the calibration terminals 16.

Figure 3:
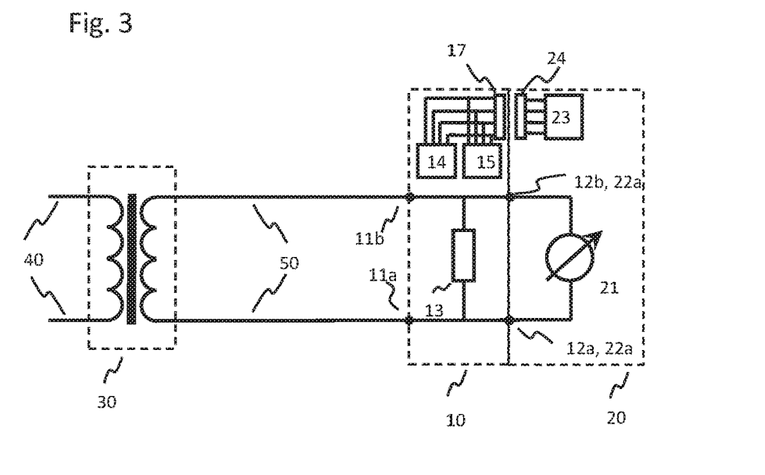
FIG. 3 schematically depicts an exemplary embodiment of the third aspect of the present invention. Elements of this figure may not be proportional to one another.

FIG. 3 schematically illustrates a further exemplary embodiment of a system for current measurement in a power grid according to the present invention. This system comprises a primary device or a primary current transformer 30, an Intelligent Electronic Device IED 20, and a terminal block 10. The terminal block 10, the IED 20 and the system, comprising the IED 20 and the terminal block 10, as illustrated in FIG. 3 also represent aspects of the present invention. In addition to the embodiments illustrated in FIG. 1 and FIG. 2, the terminal block 10 and the IED 20 further comprises a wireless transmission unit 17 and a wireless receiving unit 24, respectively. All features disclosed in context of the embodiments illustrated in FIG. 1 and FIG. 2 can also be implemented in the embodiments illustrated in FIG. 3 and/or disclosed in the following. The wireless transmission unit 17 can, e.g., be an RFID unit, a ZigBee unit, or a Bluetooth unit, and is adapted/configured to provide or provides the IED with at least parts of the calibration parameters of the shunt or of the terminal block. The IED 20 comprises a wireless receiving unit 24 and is adapted/configured to receive or receives at least parts of the calibration parameters of the shunt 13 or of the terminal block 10. The wireless receiving unit 24 communicates with the calibration unit 23 in the IED 20, e.g., via a digital data bus; in alternative embodiments, the wireless receiving unit may be incorporated into the calibration unit 23. Also, power can be supplied to the terminal block via the wireless transmission unit 17, e.g., in case of RFID. Alternatively, the terminal block 10 can comprise a battery and/or an energy harvesting module for power supply. As a further alternative, schematically illustrated in FIG. 4, the terminal block 10 can comprise calibration terminals 16 adapted/configured to transmit power to the terminal block and may be formed as second plug-in connectors. Correspondingly, the IED 20 comprises second IED terminals 22b that are releasably connectable or connected to the calibration terminals and are adapted/configured to transmit power from the IED 20 to the terminal block 10 and may be formed as second socket connectors.

Figure 4:
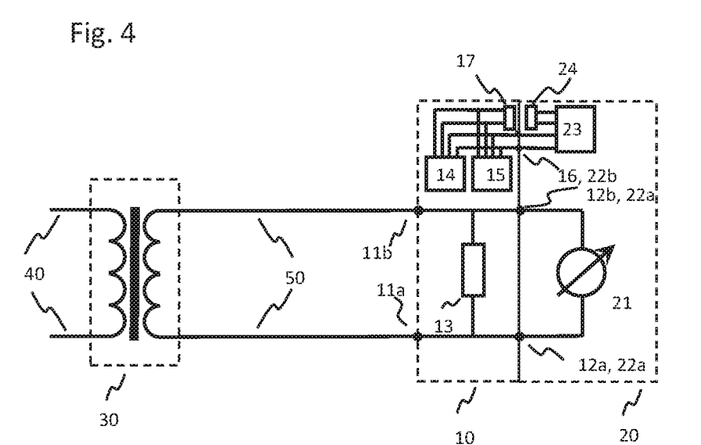
FIG. 4 schematically depicts an exemplary embodiment of the third aspect of the present invention. Elements of this figure may not be proportional to one another.

For embodiments as illustrated in FIG. 3 or FIG. 4, the wireless transmission unit 17 is adapted/configured to provide or provides the IED 20 with at least parts of the calibration parameters of the shunt 13 that may comprise the temperature of the terminal block as first data item and the calibration data as second data item. To this end, the wireless transmission unit 17 is communicatively linked to the temperature sensor 14 and the memory 15, e.g., via an I$^2$C bus. Temperature sensor 14 and/or memory may also be part of the same component as the wireless transmission unit 17. In embodiments alternative to the embodiments illustrated in FIG. 3 or FIG. 4, the terminal block 10 may not comprise a memory; the calibration data of the shunt may be provided to the IED as discussed in the context of the embodiment illustrated in FIG. 1.

The terminal block 10 according to the first aspect of the present invention may comprise more than one shunt 13, e.g., two, three, or six shunts. In this case, the terminal block 10 may also comprise additional respective first 11a and second current terminals 11b and respective first 12a and second sensing terminals 12b. The terminal block 10 may comprise one or more temperature sensors 14; e.g., one temperature sensor 14 per shunt 13, each temperature sensor 14 may then be arranged close to the corresponding shunt 13, e.g., less than 5 cm or 1cm away from the corresponding shunt 13, or in thermal contact to the shunt 13. In exemplary embodiments, the terminal block 10 can comprise one memory 15 for the terminal block 10 or one memory 15 per shunt 13. In the case of more than one shunt 13 in the terminal block 10, also the IED 20 according to the second aspect of the invention comprises more than one voltage measurement unit 21 such that the voltage drop at each shunt 13 can be measured by a voltage measurement unit 21 in the IED 20. Such a terminal block 10 may also be adapted/configured to be connected to more than one primary device 30.

Figure 5:
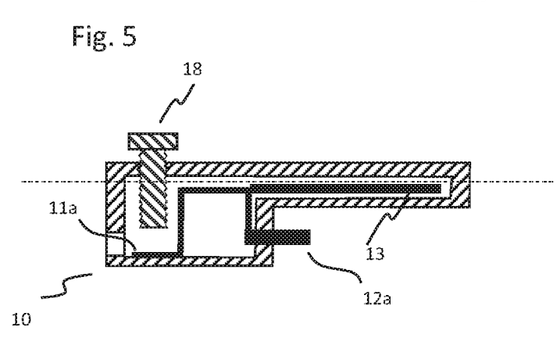
FIG. 5 schematically depicts a cross-section view of an exemplary embodiment of the first aspect of the present invention. The dashed line indicates the plane of cross-section of FIG. 6.
Figure 6:
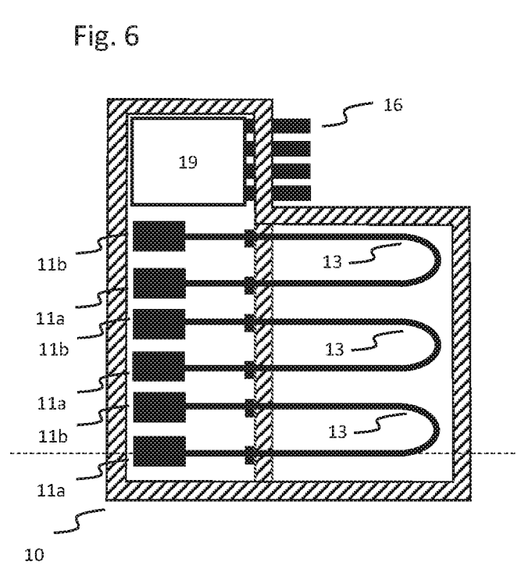
FIG. 6 schematically depicts a cross-section view of an exemplary embodiment of the first aspect of the present invention. The dashed line indicates the plane of cross-section of FIG. 5.

FIG. 5 and FIG. 6 illustrate cross-section views of exemplary embodiments of the first aspect of the present invention; the dashed line in FIG. 5 and indicates the plane of cross-section of FIG. 6 and vice versa. The terminal block 10 comprises a housing, three shunts 13, three corresponding first 11a and second 11b current terminals, three first 12a and second 12b sensing terminals, and calibration terminals 16. A clamping screw 18, left away for clarity in FIG. 6, at the first 11a and second 11b current terminals enables clamping of wires connected to the primary device. The terminal block 10 may further comprise a printed circuit board assembly 19 that may comprise a temperature sensor 14, a memory 15, and/or a wireless transmission unit 23. As illustrated in FIG. 5 and FIG. 6, the shunts are arranged in a nose or projection of the terminal block 10. The IED 20 according to the second aspect of the invention may comprise a recess such that, when the terminal block 10 is connected to the IED 20, the nose or projection resides in the recess.

In addition or as an alternative to features of the embodiments illustrated in FIGS. 1 to 6, a terminal block 10 according to the present invention can have further means to transmit power to the terminal block 10 and/or to provide the IED 20 with at least parts of the calibration parameters of the shunt 13. E.g., a fiber-optical link can be used. To this end, the terminal block 10 and the IED 20 may have a fiber-optical terminal. The terminal block 10 may further comprise a plastic housing.

Figure 7:
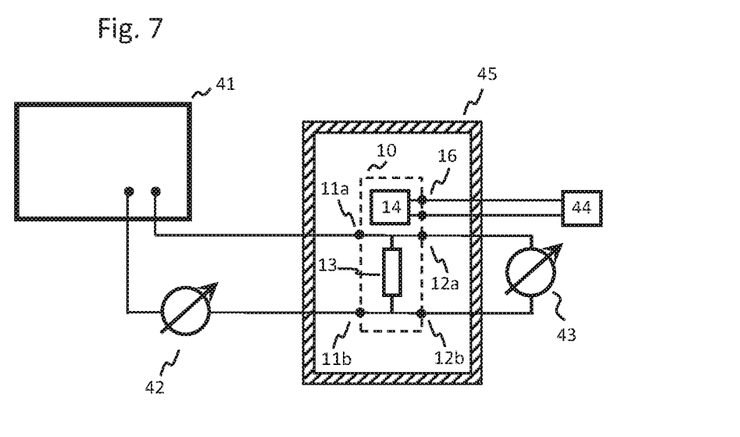
FIG. 7 schematically depicts an exemplary setup to execute the method according to a fourth aspect of the present invention.

The present invention enables an efficient method for calibration of a system for current measurement or a terminal block for current measurement. An exemplary setup to conduct the method according to a fourth aspect of the present invention is illustrated in FIG. 7. A first 11a and a second current terminal 11b of a terminal block 10 is connected to the outputs of a current supply 41. A first 12a and a second sensing terminal 12b of the terminal block 10 are connected to inputs of a voltmeter 43. The voltmeter 43 can be a voltage measurement unit 21 in an IED 20 according to a second aspect of the present invention or can be any other voltmeter e.g., a digital voltmeter or a multimeter. A shunt 13 in the terminal block 10 is connected with a first end to the first current terminal 11a and the first sensing terminal 12a and with a second end to the second current terminal 11b and second sensing terminal 12b. The current supply 41 provides a current that flows through the shunt 13 and generates a voltage drop at the shunt 13. The terminal block 10 is exposed to at least two, in particular, at least five, more particular, at least ten, temperatures, e.g., by placing the terminal block 10 in a climate chamber 45 or oven or attaching it to a Peltier element. The at least two temperatures are, e.g., within a temperature range of operation of the terminal block and/or the IED, e.g., from −20° C. to 60° C. or −40° C. to 85° C., or are equally distributed within this range. Respective at least two voltage drops at the shunt 13 in the terminal block 10 are measured via the voltmeter 43. Also, respective at least two currents may be measured, e.g., by a current meter 42, integrated in the current supply 41 or arranged in the electrical circuit between current supply 41 and one of the first 11a and the second current terminal 11b; alternatively, the current of the current supply 41 may be set to a fixed value that is controlled by the current supply 41. The at least two temperatures are measured, e.g., by a temperature sensor 14 in the terminal block 10 or by an external temperature sensor attached or close to the terminal block 10. The at least two temperatures measured by the temperature sensor 14 or by an external temperature sensor are read out by a temperature sensor readout unit 44, in particular via calibration terminals 16 of the terminal block 10 when the temperature sensor 14 in the terminal block 10 is used. The temperature sensor readout unit 44 may be an independent device or may be a calibration unit 23 in an IED 20 according to a second aspect of the present invention. The voltmeter 43, the temperature sensor readout 44, the current supply 41, and/or the current meter 42 may also be exposed to the at least two temperatures, e.g., by being placed in the climate chamber or the oven, or may be exposed to a room temperature e.g., by being placed outside the climate chamber or the oven. Calibration data of the shunt is derived, from the at least two temperatures and the respective at least two voltage drops. It goes without saying that the calibration data may also be derived from the current or the respective at least two currents; i.e., also knowledge of current or the respective at least two currents is required to calculate a resistance of the shunt or a number indicative of the resistance of the shunt. The calibration data of the shunt 13 is a second data item of the calibration parameters of the shunt. It can be a look-up table, e.g., a table of temperature vs. resistance, or a functional dependence giving the resistance as a function of the temperature, e.g., a linear or polynomial function, in particular, a polynomial of $3^{rd}$ or $4^{th}$ order. It goes without saying that instead of temperature or resistance also values indicative of the same can be used, e.g., conductance instead of resistance and a thermistor resistance instead of temperature. The calibration data of the shunt is stored, e.g., in a memory 15 in the terminal block 10, in an IED 20 configured/adapted to be releasably connected to the terminal block, in a calibration document, in a calibration record, e.g., a QR code or a label, e.g. attached to a housing of terminal block 10, in a cloud storage, or in a portable memory. If the calibration data is not already stored in the IED 20, the calibration may be loaded onto the IED 20, in particular at or before commissioning of the system for current measurement. The calibration data can, e.g., be loaded from a memory 15 in the terminal block 10, in particular after connecting the terminal block 10 to the IED 20, or from a cloud storage or a portable memory, such as a flash drive or a memory stick. The calibration data can also be programmed, in particular manually programmed, into the IED 20 using a calibration record. The voltage measurement unit in the IED 20 may be calibrated, in particular, before connecting the terminal block 10 to the IED 20.

A method for current measurement is a further aspect of the present invention. A current measurement system or a terminal block, according to aspects of the present invention with exemplary embodiments illustrated in FIGS. 1 to 4, may be used according to this method.

Secondary outputs of a primary device 30, such as a current transformer are connected to a first 11a and a second current terminal 11b of a terminal block 10. The terminal block 10 may be according to a first aspect of the present invention. The primary device 30 can be a current transformer or any device that is connected to a wire, a primary line, wires or primary lines of a power grid and comprises a secondary current output that provides a secondary current that is at least during normal operation proportional or essentially proportional to the primary current, e.g., in the primary line. A first 12a and a second sensing terminal 12b of the terminal block 10 are connected to inputs of a voltage measurement unit 21 in an Intelligent Electronic Device IED 20. The IED 20 may be according to a second aspect of the present invention. A voltage drop at a shunt 13 in the terminal block is measured via the voltage measurement unit 21, wherein the shunt 13 is connected with a first end to the first current terminal 11a and the first sensing terminal 12a and with a second end to the second current terminal 11b and the second sensing terminal 12b. Further, a temperature of the terminal block 10, in particular a temperature of the shunt 13, in particular, via a temperature sensor located in the terminal block 10 or close to the terminal block, is measured. The temperature may be a first data item of calibration parameters of the shunt 13; calibration data of the shunt 13 may be a second data item of the calibration parameters of the shunt. The calibration data of the shunt 13 may have been derived according to the fourth aspect of the present invention. The IED 20 may be provided with at least parts of the calibration parameters of the shunt, e.g., by loading the calibration data of the shunt into the IED 20, in particular, from a memory 15 in the terminal block 10. Alternatively, the calibration data may already be stored in the IED 20. A current flowing through the shunt 13, i.e., the secondary current, and/or a primary current of the primary device, is calculated from the voltage drop and the temperature, in particular, in the IED 20, using the calibration data of the shunt 13.

While the invention has been described in detail in the drawings and foregoing description, such description is to be considered illustrative or exemplary and not restrictive. Variations to the disclosed embodiments can be understood and effected by those skilled in the art and practising the claimed invention, from a study of the drawings, the disclosure, and the appended claims. In the claims, the word "comprising" does not exclude other elements or steps, and the indefinite article "a" or "an" does not exclude a plurality. The mere fact that certain elements or steps are recited in distinct claims does not indicate that a combination of these elements or steps cannot be used to advantage, specifically, in addition to the actual claim dependency, any further meaningful claim combination shall be considered disclosed.

LIST OF REFERENCE SYMBOLS 10 terminal block
20 Intelligent Electronic Device IED
40 primary device, primary current transformer
40 primary lines
50 wires, secondary lines
11a, 11b first, second current terminal
12a, 12b first, second sensing terminal, first plug-in connectors
13 shunt
14 temperature sensor
15 memory
16 calibration terminals, second plug-in connectors
17 wireless transmission unit
18 clamping screw
19 printed circuit board assembly
21 voltage measurement unit
22a first IED terminals, first socket connectors
22b second IED terminals, second socket connectors
23 calibration unit
24 wireless receiving unit
41 current supply
42 current meter
43 voltmeter
44 temperature sensor readout unit
45 climate chamber

The invention claimed is:

1. A terminal block for current measurement in a power grid, comprising:
a shunt,
first and second current terminals,
first and second sensing terminals, and
a temperature sensor,
wherein
a first end of the shunt is connected to the first current terminal and to the first sensing terminal,
a second end of the shunt is connected to the second current terminal and to the second sensing terminal,
the first and the second current terminals are configured to be connected to secondary outputs of a primary device,
the first and the second sensing terminal are configured to be releasably connected to an Intelligent Electronic Device (IED), wherein the IED is external to the terminal block, and
the temperature sensor is configured to measure a temperature of the terminal block that is a first data item of calibration parameters of the shunt.

2. The terminal block according to claim 1, further comprising a memory adapted to store calibration data of the shunt, the calibration data being a second data item of the calibration parameters of the shunt.

3. The terminal block according to claim 2, wherein the first and second sensing terminals are formed as first plug-in connectors configured to be plugged into first socket connectors of the IED.

4. The terminal block according to claim 2, further comprising means adapted to provide the IED with at least parts of the calibration parameters of the shunt.

5. The terminal block according to claim 2, further comprising:
calibration terminals configured to be releasably connected to the IED, wherein the calibration terminals are adapted
to transmit power to the terminal block and/or
to provide the IED with at least parts of the calibration parameters of the shunt.

6. The terminal block according to claim 1, wherein the first and second sensing terminals are formed as first plug-in connectors configured to be plugged into first socket connectors of the IED.

7. The terminal block according to claim 6, further comprising means adapted to provide the IED with at least parts of the calibration parameters of the shunt.

8. The terminal block according to claim 6, further comprising:
calibration terminals configured to be releasably connected to the IED, wherein the calibration terminals are adapted
to transmit power to the terminal block and/or
to provide the IED with at least parts of the calibration parameters of the shunt.

9. The terminal block according to claim 1, further comprising means adapted to provide the IED with at least parts of the calibration parameters of the shunt.

10. The terminal block according to claim 1, further comprising:
calibration terminals configured to be releasably connected to the IED, wherein the calibration terminals are adapted
to transmit power to the terminal block and/or
to provide the IED with at least parts of the calibration parameters of the shunt.

11. The terminal block according to claim 10, wherein the calibration terminals are formed as second plug-in connectors configured to be plugged into second socket connectors of the IED.

12. The terminal block according to claim 1, wherein the first and second sensing terminals are configured to be connected to first and second inputs of a voltage measurement unit in the IED.

13. The terminal block according to claim 1, wherein the first and second current terminals are adapted to clamp wires connected to the primary device.

14. A system for current measurement in a power grid, comprising the terminal block according to claim 1, wherein the IED is releasably connected to the terminal block.

15. The system according to claim 14, further comprising:
the primary device with secondary outputs connected to the first and second current terminals of the terminal block.

16. The terminal block according to claim 1, further comprising a housing that comprises the shunt, the first and second current terminals, the first and second sensing terminals, and the temperature sensor.

17. An Intelligent Electronic Device (IED) for current measurement in a power grid, configured to be releasably connected to a terminal block, comprising a shunt, first and second current terminals, first and second sensing terminals, and a temperature sensor, wherein a first end of the shunt is connected to the first current terminal and to the first sensing terminal, a second end of the shunt is connected to the second current terminal and to the second sensing terminal, the first and the second current terminals are configured to be connected to secondary outputs of a primary device, and the temperature sensor is configured to measure a temperature of the terminal block that is a first data item of calibration parameters of the shunt, wherein the IED comprises:
  first IED terminals, configured to be connected to the first and the second sensing terminal of the terminal block;
  second IED terminals and/or a wireless receiving unit adapted to receive at least parts of the calibration parameters of the shunt;
  a voltage measurement unit with inputs connected to the first IED terminals and adapted to be connected via the first IED terminals with the first and second sensing terminals of the terminal block and to measure a voltage drop at the shunt; and
  a calibration unit that is configured or adapted to calculate, from the calibration parameters of the shunt or the parts of calibration parameters of the shunt and the voltage drop at the shunt, a current flowing through the shunt and/or a primary current of the primary device.

18. A method for calibrating a current measurement system in a power grid, comprising:
  connecting first and second current terminals of a terminal block to outputs of a current supply, wherein the terminal block is external to an Intelligent Electronic Device (IED),
  connecting the first and second current sensing terminals of the terminal block to inputs of a voltmeter,
  measuring, at least two temperatures of the terminal block, respective at least two voltage drops at a shunt in the terminal block via the voltmeter, wherein the shunt is connected with a first end to the first current terminal and the first current sensing terminal and with a second end to the second current terminal and the second current sensing terminal,
  measuring the at least two temperatures of the terminal block,
  deriving, from the at least two temperatures of the terminal block and the respective at least two voltage drops, calibration data of the shunt, and
  storing the calibration data of the shunt.

19. The method according to claim 18, further comprising:
  loading the calibration data of the shunt into the IED.

20. A method for measuring a current in a power grid, comprising:
  connecting secondary outputs of a primary device to first and second current terminals of a terminal block,
  connecting the first and second current sensing terminals of the terminal block to inputs of a voltage measurement unit in an Intelligent Electronic Device (IED), the terminal block being external to the IED,
  measuring a voltage drop at a shunt in the terminal block via the voltage measurement unit, wherein the shunt is connected with a first end to the first current terminal and the first sensing terminal and with a second end to the second current terminal and the second current sensing terminal,
  measuring a temperature of the terminal block, and
  calculating, using calibration data of the shunt, from the voltage drop and the temperature of the terminal block, a current flowing through the shunt.

21. The method according to claim 20, further comprising:
  loading the calibration data of the shunt into the IED.

* * * * *